United States Patent
Choi et al.

[19]

[11] Patent Number: 6,071,775
[45] Date of Patent: Jun. 6, 2000

[54] METHODS FOR FORMING PERIPHERAL CIRCUITS INCLUDING HIGH VOLTAGE TRANSISTORS WITH LDD STRUCTURES

[75] Inventors: Yong-bae Choi; Keon-soo Kim, both of Kyungki-do, Rep. of Korea

[73] Assignee: Samsung Electronics Co., Ltd., Rep. of Korea

[21] Appl. No.: 08/961,457

[22] Filed: Oct. 30, 1997

Related U.S. Application Data

[62] Division of application No. 08/804,065, Feb. 21, 1997, Pat. No. 5,917,218.

[51] Int. Cl.$^7$ .................... H01L 21/336; H01L 21/8238
[52] U.S. Cl. ............................................ 438/257; 438/231
[58] Field of Search .................... 257/203, 763, 257/336, 408; 438/688, 514, 231, 257

[56] References Cited

U.S. PATENT DOCUMENTS

| | | | |
|---|---|---|---|
| 4,471,523 | 9/1984 | Hu ................................................ | 29/571 |
| 5,182,619 | 1/1993 | Pfiester .................................... | 257/382 |
| 5,329,138 | 7/1994 | Mitani et al. ............................. | 257/42 |
| 5,355,011 | 10/1994 | Takata ..................................... | 257/408 |
| 5,472,887 | 12/1995 | Hutter et al. ............................ | 438/231 |
| 5,573,962 | 11/1996 | Sung ........................................ | 438/231 |
| 5,573,963 | 11/1996 | Sung ........................................ | 437/34 |
| 5,773,336 | 6/1998 | Gu ........................................... | 438/199 |

FOREIGN PATENT DOCUMENTS

| | | | |
|---|---|---|---|
| 62-54466 | 3/1987 | Japan ............................. | H01L 29/78 |
| 63-38260 | 2/1988 | Japan ............................. | H01L 29/78 |

OTHER PUBLICATIONS

Wolf, "Silicon Processing for the VLSI Era vol. 2 Process Intergration" p 382 and pp 387–388, 1990.

*Primary Examiner*—John F. Niebling
*Assistant Examiner*—Walter L. Lindsay, Jr.
*Attorney, Agent, or Firm*—Myers Bigel Sibley & Sajovec

[57] ABSTRACT

A peripheral circuit for a nonvolatile integrated circuit memory device includes a semiconductor substrate with a well region having a first conductivity type adjacent a face of the substrate. A first transistor on the well region includes a first gate insulating layer, a first gate electrode, first lightly doped regions in the well region adjacent opposite sides of the first gate electrode, and first heavily doped regions in the well region adjacent the first lightly doped regions opposite the first gate electrode. The first gate insulating layer is adjacent the first well region and has a first thickness. The first gate electrode is on the first gate insulating layer, and the first lightly doped regions define a first transistor channel therebetween and have a second conductivity type and a first light dopant concentration. The first heavily doped regions have the second conductivity and a first heavy dopant concentration. A second transistor on the well region includes a second gate insulating layer, a second gate electrode, second lightly doped regions in the second well region adjacent opposite sides of the second gate electrode, and second heavily doped regions in the second well region adjacent the second lightly doped regions opposite the second gate electrode. The second gate insulating layer has a second thickness less than the first thickness. The second lightly doped regions define a second transistor channel therebetween and have the second conductivity type and a second light dopant concentration. The second heavily doped regions have the first conductivity and a second heavy dopant concentration. Related methods are also discussed.

18 Claims, 14 Drawing Sheets

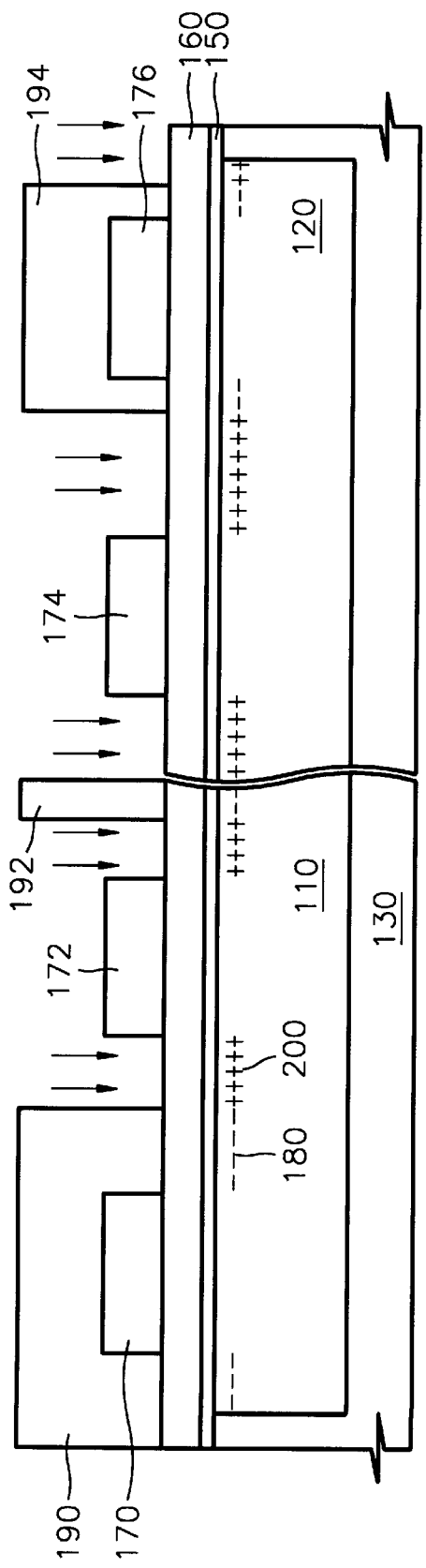
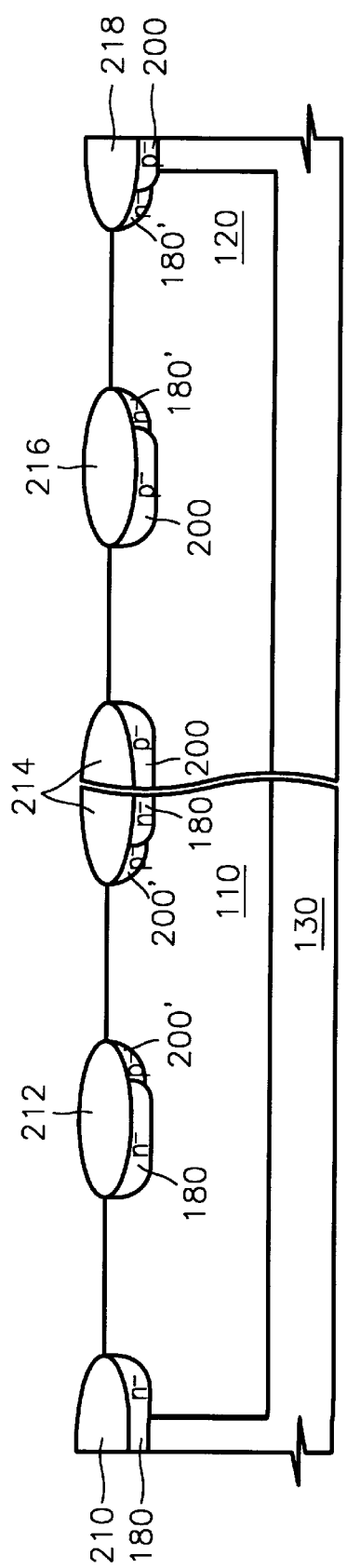

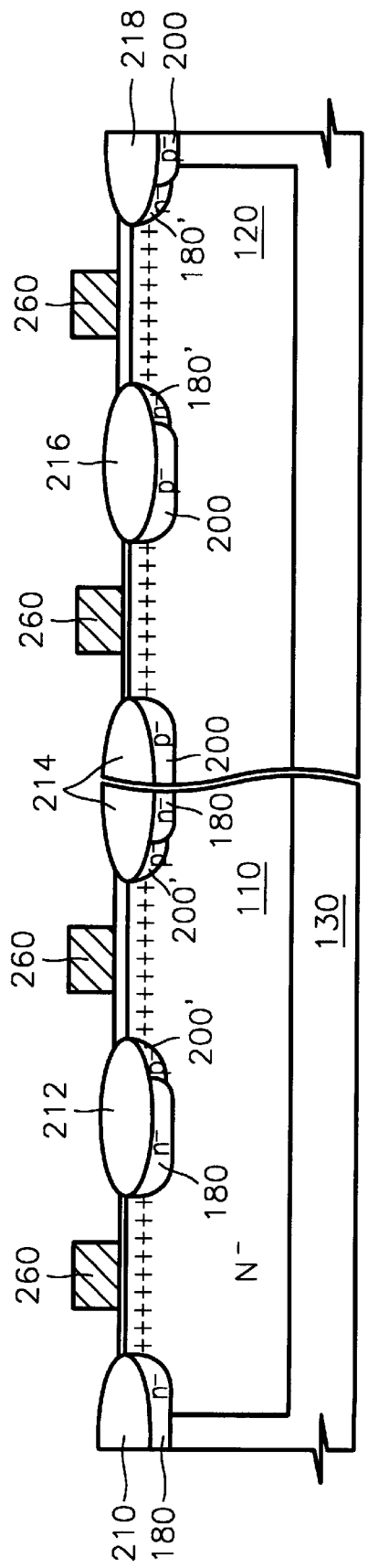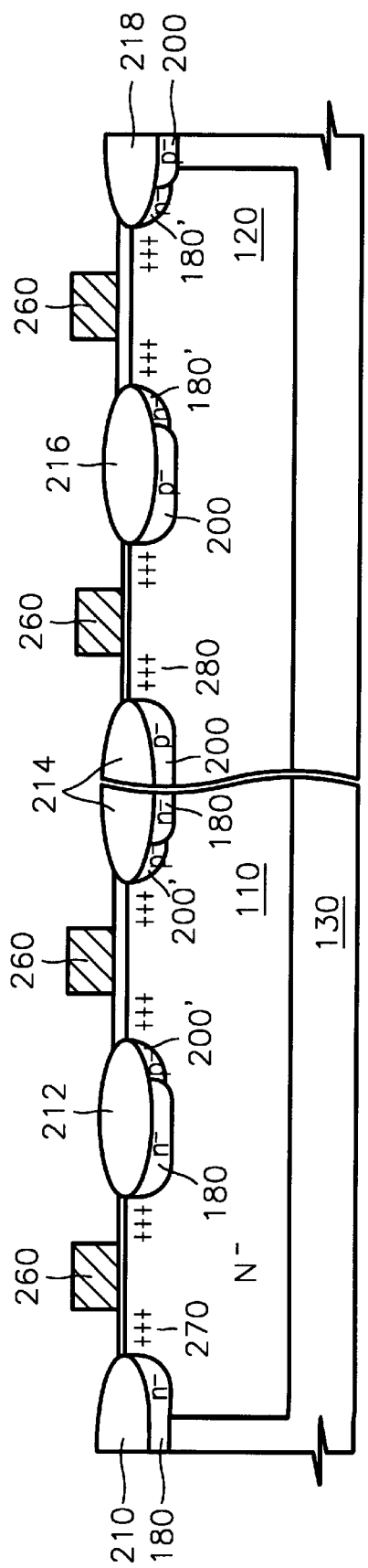

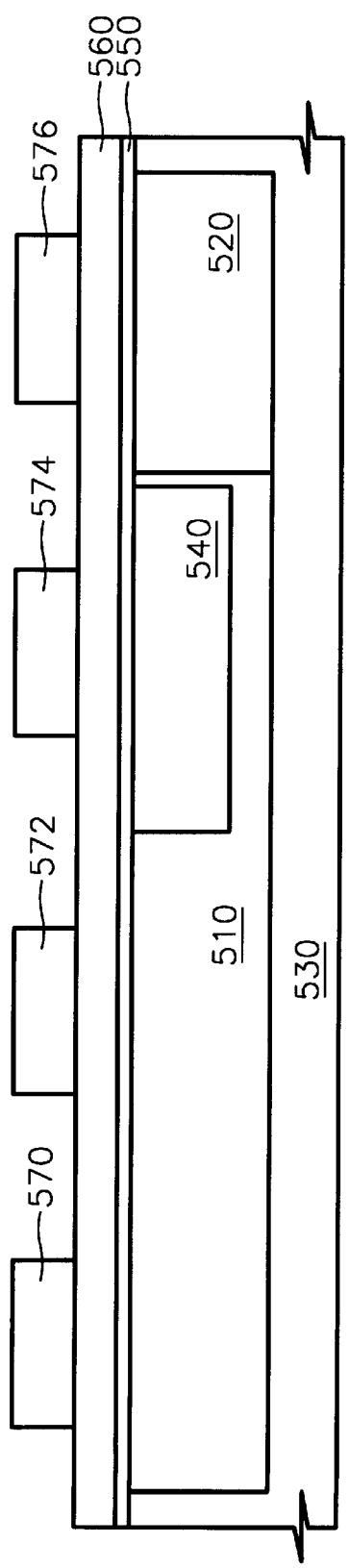
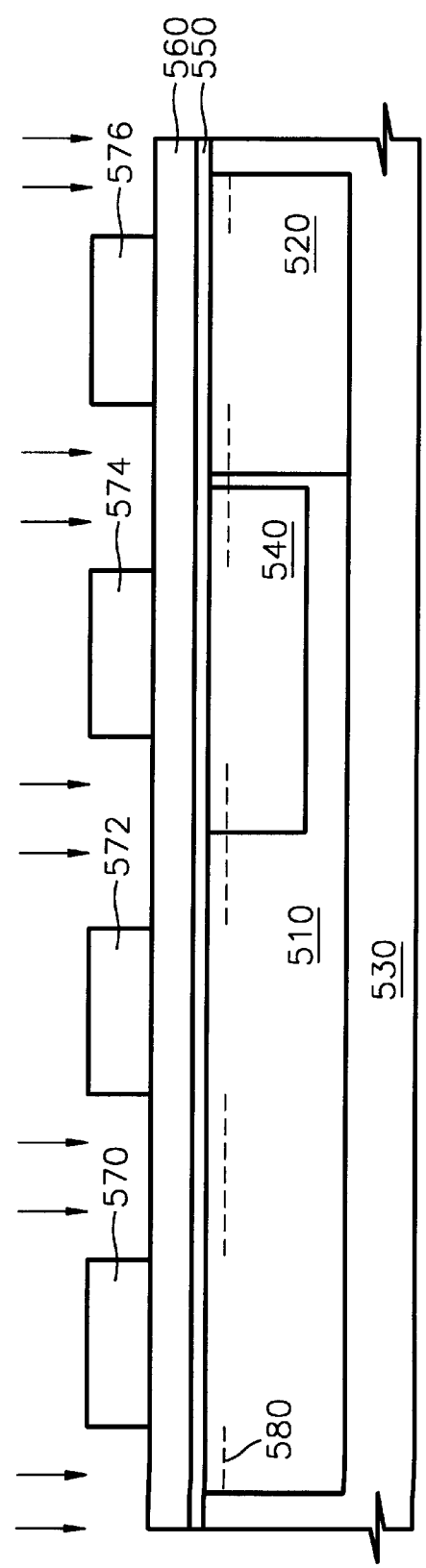

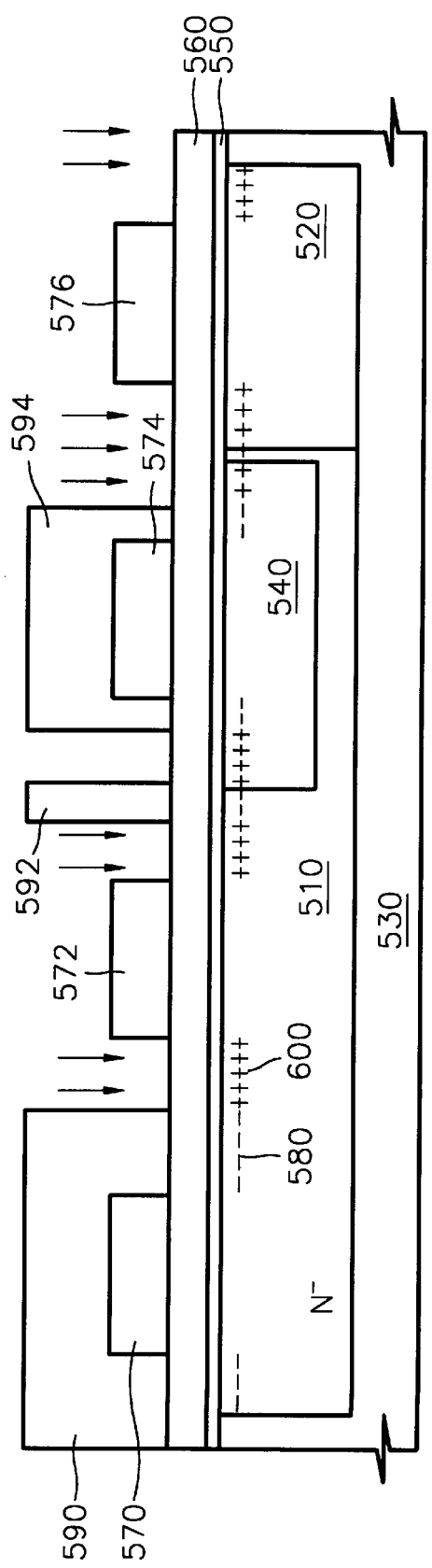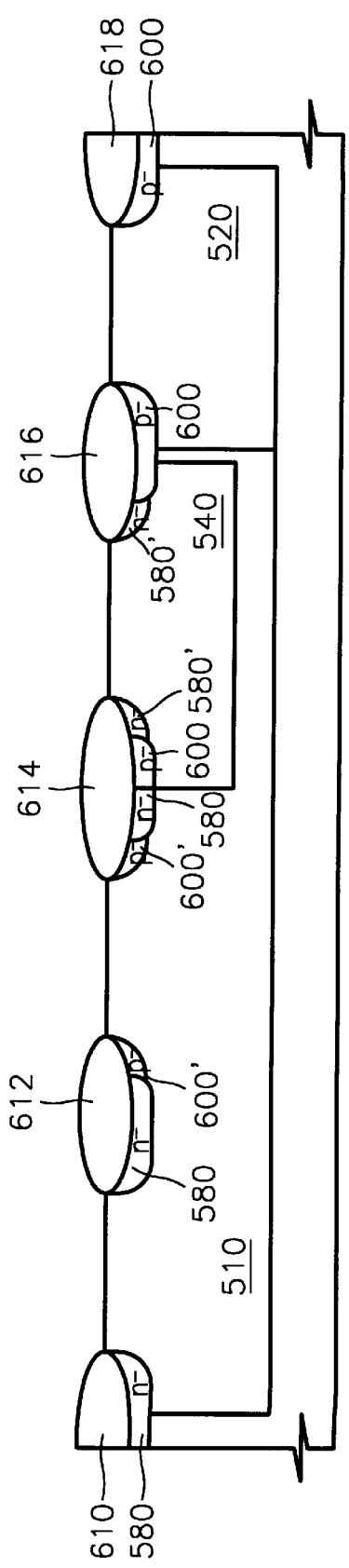

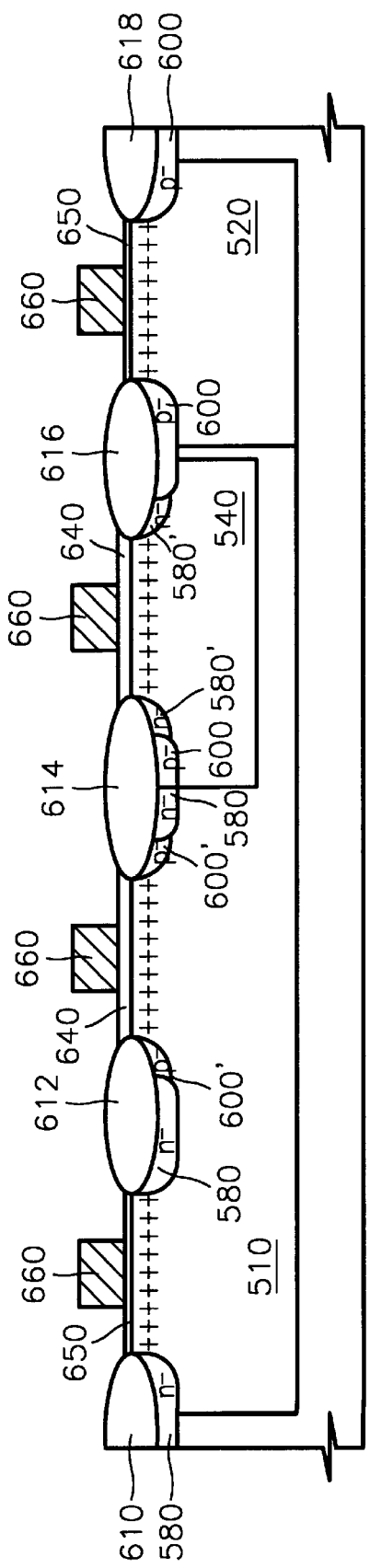
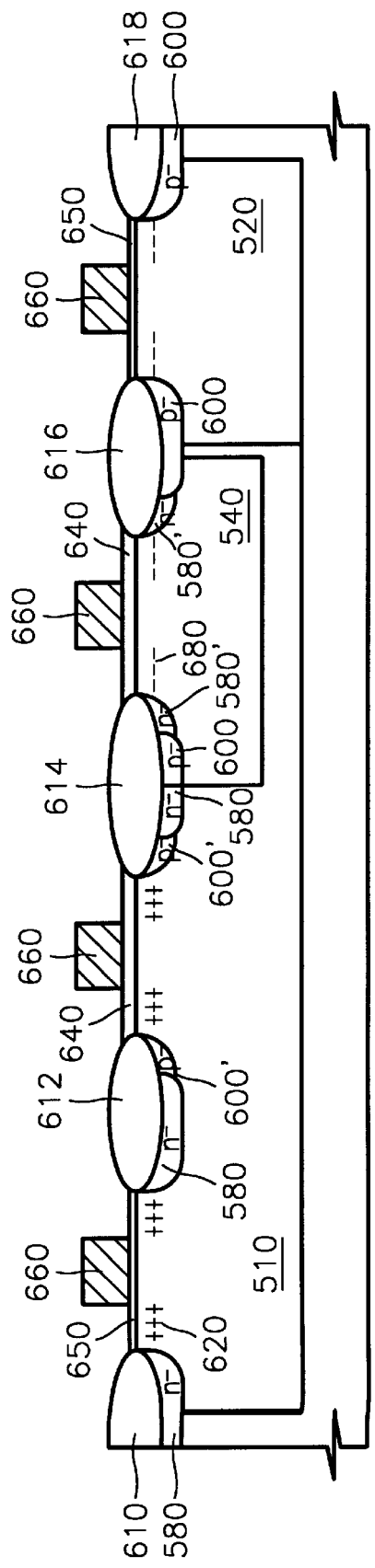

6,071,775

METHODS FOR FORMING PERIPHERAL CIRCUITS INCLUDING HIGH VOLTAGE TRANSISTORS WITH LDD STRUCTURES

This application is a divisional of application Ser. No. 08/804,065, filed Feb. 21, 1997, now U.S. Pat. No. 5,917,218.

FIELD OF THE INVENTION

The present invention relates to the field of integrated circuits and more particularly to nonvolatile integrated circuit memory devices.

BACKGROUND OF THE INVENTION

Integrated circuit memory devices can be classified into two groups: nonvolatile memory devices and volatile memory devices. In a nonvolatile memory device, data is stored in a memory cell including a floating gate and a control gate. The floating gate includes a tunnel oxide layer on a semiconductor substrate, and the control gate includes an oxide/nitride/oxide (ONO) layer formed on the floating gate.

A nonvolatile memory cell typically performs three operations: erase operations, program operations, and read operations. Program operations can be performed by charging the floating gate with electrons. In particular, the floating gate can be charged through hot channel electron injection by applying a voltage of approximately 6V to 7V to the drain and applying a higher voltage on the order of 12V to the gate. Erase operations can be performed by grounding (Vg=0V) the gate and applying a relatively high voltage on the order of a 12V supply voltage to the source. These conditions may generate Fowler-Nordheim (F-N) tunneling to the source, thereby discharging electrons from the floating gate. Read operation can be performed by detecting an "ON" or "OFF" state of the memory cell by detecting a current flowing through the memory cell.

Peripheral circuit transistors are generally required in a nonvolatile memory device to perform the above mentioned erase, program, and read operations. These peripheral circuit transistors may include a low voltage PMOS transistor, a high voltage NMOS transistor, and a low voltage NMOS transistor. FIGS. 1A through 1F are cross sectional views illustrating steps of a method for forming a high voltage NMOS transistor, a low voltage NMOS transistor and a low voltage PMOS transistor for a peripheral circuit of a conventional nonvolatile memory device.

As shown in FIG. 1A, an N-well 10 and a P-well 12 are formed in the P-type semiconductor substrate 14. A low voltage PMOS transistor will be formed on the N-well 10, a low voltage NMOS transistor will be formed on the P-well 12, and a high voltage NMOS transistor will be formed on the P-type semiconductor substrate 14. A pad oxide layer and a nitride layer are formed on the substrate covering the N-well and P-well, and these layers are patterned to form the pad oxide layers 16 and the nitride layers 18 which cover active regions of the substrate. A patterned photoresist layer 20 is then formed exposing the P-well 12 and covering the N-well 10 and the P-type semiconductor substrate 14. P-type dopants 22, such as boron, are then implanted using the patterned photoresist layer 20 and the nitride layer 18 as masks to form an N⁻ channel stopper 24.

The first patterned photoresist layer 20 is then removed, and a second patterned photoresist layer 26 is formed on the substrate. The second patterned photoresist layer exposes portions of the P-type semiconductor substrate 14 spaced apart from the nitride layer 18, as shown in FIG. 1B. P-type dopants 28, such as boron atoms, are implanted using the second patterned photoresist layer 26 as a mask to form an N⁻ channel stopper 30. The photoresist layer 26 extends beyond the nitride layer 18 over isolation regions of the P-type substrate 14 by a distance d. Accordingly, even if the high voltage NMOS transistor is subsequently formed with a double diffused drain (DDD) structure in which an N⁻ layer completely surrounds an N⁺ layer, the N⁻ layer will be spaced apart from the N⁻ channel stopper 30 by a predetermined distance. Because a breakdown voltage of a transistor can be increased, the method discussed above is widely used in the design of peripheral circuits using high voltages.

After removing the second patterned photoresist layer 26, a field oxide layer 32 is formed by oxidizing portions of the substrate exposed by the patterned nitride layer 18, and the nitride layer 18 and the oxide layer 16 are removed, as shown in FIG. 1C. Gate oxide layers 34 of the low voltage PMOS transistor and the low voltage NMOS transistor and a gate oxide layer 36 of the high voltage NMOS transistor are then formed. As shown, the gate oxide layer 36 of the high voltage transistor is thicker than the gate oxide layers 34 of low voltage transistors. The gate electrodes 38 are then formed on the respective gate oxide layers 34 and 36, and a third patterned photoresist layer 40 is formed exposing the active region of the substrate where the low voltage PMOS transistor is to be formed. P-type dopants 42 are then implanted at a relatively high concentration into the exposed active regions of the substrate to provide P⁺ source/drain regions 43 for the low voltage PMOS transistor.

After removing the third patterned photoresist layer 40, a fourth patterned photoresist layer 44 is formed exposing an area where the low voltage NMOS transistor is to be formed, as shown in FIG. 1D. N-type dopants 46 are then implanted with an energy of approximately 40~60 KeV at a dose of $5 \times 10^{12} \sim 1 \times 10^{13}$ cm$^{-2}$ using the fourth patterned photoresist layer 44 and the gate electrode 38 as implant masks to form the N⁻ source/drain regions 48 of the low voltage NMOS transistor.

After removing the fourth patterned photoresist layer 44, oxide spacers 49 are formed along the sidewalls of each gate electrode 38, as shown in FIG. 1E. A fifth patterned photoresist layer 50 is then formed exposing an area where the low voltage NMOS transistor is to be formed. N-type dopants 52 are implanted with an energy of approximately 40~80 KeV at a dose of approximately $5 \times 10^{15}$ cm$^{-2}$ using the fifth patterned photoresist layer 50, the gate electrode 38, and the spacers 49 as implant masks to form second N⁺ source/drain regions 54 for the low voltage NMOS transistor. The low voltage NMOS transistor having the LDD structure is thus complete.

After removing the fifth photoresist pattern 50, a sixth patterned photoresist layer 56 is formed exposing an area where the high voltage NMOS transistor is to be formed, as shown in FIG. 1F. N-type dopants 58, such as Phosphorus (P) and arsenic (As) ions, are simultaneously implanted using the sixth patterned photoresist layer 56, the gate electrode 38, and the spacers 49 as implant masks. In particular, the phosphorus (P) ions can be implanted at a dose of approximately $1 \times 10^{14} \sim 1 \times 10^{15}$ cm$^{-2}$ and the arsenic (As) ions can be implanted at a dose of approximately $5 \times 10^{15}$ cm$^{-2}$, with an energy of approximately 100 KeV. If a high temperature anneal is then performed, the phosphorus (P) ions may diffuse more rapidly, thereby completing a high voltage NMOS transistor with a double diffused drain (DDD) structure in which the N⁻ phosphorous dopant region 62 completely surrounds the N⁺ dopant region 60.

According to the method discussed above, the second patterned photoresist layer 26 determines a spacing between the N⁻ impurity region 62 of the high voltage NMOS transistor and the P⁻ channel stopper 30. Accordingly, it may be necessary to form the second patterned photoresist layer in addition to the first patterned photoresist layer to provide a desired spacing. In addition, separate steps may be needed to form the source/drain regions for the high voltage NMOS transistor with the DDD structure and to form the source/drain regions for the low voltage NMOS transistor. This method may be further complicated in that a step of forming a sixth patterned photoresist layer 56 may be required when forming the high voltage NMOS transistor having the DDD structure. Furthermore, the N⁻ region 62 for the high voltage NMOS transistor may diffuse laterally thus degrading a punchthrough characteristic of the transistor.

In a conventional nonvolatile memory device, however, a source leakage current may increase due to parasitic holes when a high voltage of about 12V is applied to a source during an erase operation. The erase operation may thus make it difficult scale a memory cell down to a submicron level. The increase in the leakage current due to the generation of hot holes can be reduced by applying a negative bias to a gate during erase operations. In order to apply the negative bias to the gate, a high voltage PMOS transistor may be required in the peripheral circuit. Methods of forming a high voltage PMOS transistor in the peripheral circuit having the conventional low voltage PMOS transistor, high voltage NMOS transistor and low voltage NMOS transistor have thus been proposed. The method of manufacturing the peripheral circuit for a nonvolatile memory device having such a high voltage PMOS transistor is similar to that shown in FIGS. 1A through 1F.

Because the peripheral circuit for the nonvolatile memory device may require a step of forming a patterned photoresist layer when forming a P⁻ channel stopper for the high voltage PMOS transistor and a step of forming another patterned photoresist layer when forming a source/drain region of the high voltage PMOS transistor, the fabrication process may become more complex. In addition, the N⁻ impurity region of the high voltage NMOS transistor may laterally diffuse, thereby degrading a punchthrough characteristic.

SUMMARY OF THE INVENTION

It is therefor an object of the present invention to provide improved peripheral circuits and methods for nonvolatile memory devices.

It is another object of the present invention to provide nonvolatile memory peripheral circuits including transistors with increased breakdown voltages and related methods for forming the transistors.

It is still another object of the present invention to provide nonvolatile memory peripheral circuits including transistors with improved punchthrough characteristics and related methods for forming the transistors.

These and other objects according to the present invention can be obtained by peripheral circuits including a semiconductor substrate with a well region having a first conductivity type, and first and second transistors on the well region. The first transistor includes a first gate insulating layer, a first gate electrode, first lightly doped regions, and first heavily doped regions, and the second transistor includes a second gate insulating layer, a second gate electrode, second lightly doped regions, and second heavily doped regions. Accordingly, the first and second transistors can both have a lightly doped drain structure thus reducing the number of steps needed to form the peripheral circuit.

In particular, the first gate insulating layer is on the face of the substrate adjacent the first well region, and the first gate insulating layer has a first thickness. The first gate electrode is on the first gate insulating layer opposite the substrate. The first lightly doped regions are in the first well region adjacent opposite sides of the first gate electrode and define a first transistor channel therebetween. The first lightly doped regions also have a second conductivity type and a first light dopant concentration. The first heavily doped regions are in the first well region adjacent the first lightly doped regions opposite the first gate electrode. The first heavily doped regions have the second conductivity and a first heavy dopant concentration which is higher than the first light dopant concentration.

The second gate insulating layer is on the face of the substrate adjacent the second well region wherein the second gate insulating layer has a second thickness less than the first thickness. The second gate electrode is on the second gate insulating layer opposite the substrate. The second lightly doped regions are in the second well region adjacent opposite sides of the second gate electrode and define a second transistor channel therebetween, and the second lightly doped regions have the second conductivity type and a second light dopant concentration. The second heavily doped regions in the second well region are adjacent the second lightly doped regions opposite the second gate electrode, wherein the second heavily doped regions have the first conductivity and a second heavy dopant concentration which is high relative to the second light dopant concentration. Because the first transistor has a gate thickness that is greater than that of the second transistor, high and low voltage transistors with the LDD structure can be provided.

The first and second heavy dopant concentrations can be equal and the first and second light dopant concentrations can be equal. Accordingly, the source/drain regions of the first and second transistors can be formed simultaneously. In addition, the first transistor can include breakdown enhancing regions in the first well region adjacent the first heavily doped regions opposite the first lightly doped regions. The first breakdown enhancing regions have the second conductivity and a first breakdown enhancing dopant concentration which is low relative to the first heavy dopant concentration. The first breakdown enhancing regions are also separated from the first lightly doped regions by the first heavily doped regions. The breakdown voltage of the first transistor can thus be increased.

The peripheral circuit can also include first channel stopping regions in the well region adjacent the breakdown enhancing regions opposite the first heavily doped regions. The first channel stopping regions have the first conductivity type, and the first channel stopping regions have a dopant concentration which is higher than a dopant concentration of the well region. In addition, the peripheral circuit can also include an isolation layer on the face of the substrate wherein the isolation layer exposes active portions of the well region, and wherein the breakdown enhancing regions and the channel stopping regions are covered by the isolation layer.

The peripheral circuit can also include second channel stopping regions in the well region adjacent the second heavily doped regions opposite the second lightly doped regions. In particular, the second channel stopping regions have the first conductivity type, and the first channel stopping regions have a dopant concentration which is higher than a dopant concentration of the well region.

In addition, the peripheral circuit can include a second well region of the substrate having the second conductivity type adjacent the face, and a second transistor on the second well region. The second transistor includes a third gate insulating layer, a third gate electrode, third lightly doped regions, and third heavily doped regions. The third gate insulating layer is on the face of the substrate adjacent the second well region, and the third gate insulating layer has the first thickness.

The third gate electrode is on the third gate insulating layer opposite the substrate, and the third lightly doped regions are in the second well region adjacent opposite sides of the third gate electrode. The third lightly doped regions define a third transistor channel therebetween, wherein the third lightly doped regions have the first conductivity type and a third light dopant concentration. The third heavily doped regions in the second well region are adjacent the third lightly doped regions opposite the third gate electrode, and the third heavily doped regions have the first conductivity and a third heavy dopant concentration which is high relative to the third light dopant concentration.

The peripheral circuit can also include a fourth transistor on the second well region. The fourth transistor includes a fourth gate insulating layer and a fourth gate electrode. The fourth gate insulating layer is on the face of the substrate adjacent the second well region wherein the fourth gate insulating layer has the second thickness less than the first thickness. The fourth gate electrode is on the fourth insulating gate layer opposite the face of the substrate.

Furthermore, the first well region can surround the second well region thus increasing isolation and allowing a back bias to be applied to a transistor formed therein. A third well region can also be provided having the second conductivity type wherein the third well region is outside the first well region, and a fourth transistor can be provided on the third well region. This fourth transistor can include a fourth insulating gate layer and a fourth gate electrode on the fourth insulating gate layer. The fourth gate insulating layer is on the face of the substrate adjacent the third well region, and the fourth gate insulating layer has the second thickness less than the first thickness.

According to another aspect of the present invention, a method for forming a peripheral circuit for a nonvolatile memory includes the steps of forming first and second well regions in a semiconductor substrate of a first conductivity type. The first well region has the first conductivity type and the second well region has a second conductivity type. An isolation masking layer is formed on the substrate, and the isolation masking pattern exposes respective isolation regions on the first and second well regions. The isolation masking layer covers respective first and second active regions of the first and second well regions. First doped isolation regions are formed in the exposed portions of the first and second well regions of the semiconductor substrate, and the first doped isolation regions have the second conductivity type.

A second masking layer exposes portions of the isolation regions on the first well spaced from the first active region and exposes portions of the isolation regions adjacent the second active region. Second doped isolation regions are formed in the exposed portions of the isolation regions on the first well spaced from the first active region and in the exposed portions of the isolation regions adjacent the second active regions. These second doped isolation regions have the first conductivity type. The second masking layer is then removed, and an isolation layer is formed on the isolation regions. The isolation masking layer is then removed thus exposing the active regions of the substrate.

According to still another aspect of the present invention, a method for forming a peripheral circuit for a nonvolatile memory includes the steps of forming a well region of a first conductivity type in a semiconductor substrate, and forming an isolation masking layer on the substrate. The isolation masking pattern exposes respective isolation regions on the well region and the isolation masking layer covers respective first and second active regions of the well region. First doped isolation regions are formed in the exposed portions of the well region of the semiconductor substrate, and the first doped isolation regions have the second conductivity type. A second masking layer exposes portions of the isolation regions on the well region spaced from the first active region and exposes portions of the isolation regions adjacent the second active region.

Second doped isolation regions are formed in the exposed portions of the isolation regions on the first well spaced from the first active region. The second doped isolation regions are also formed in the exposed portions of the isolation regions adjacent the second active region, and the second doped isolation regions have the first conductivity type. The second masking layer is then removed, and an isolation layer is formed on the isolation regions. The isolation masking layer is removed thus exposing the active regions of the substrate.

According to the circuits and methods of the present invention, improved peripheral circuits can be provided for nonvolatile memory devices. In particular, the peripheral circuits of the present invention have a structure which reduces the complexity of the methods used to form the circuits. The peripheral circuits can also include transistors with increased breakdown voltages, and increased isolation characteristics. The methods can be performed with a reduced number of steps, and in particular, a reduced number of photolithography steps. Furthermore, the use of the LDD structure, allows the high and low voltage transistors to be doped simultaneously.

BRIEF DESCRIPTION OF THE DRAWINGS

FIGS. 4A through 4I are cross sectional views illustrating steps of a method for forming the nonvolatile memory device of FIG. 2.

FIGS. 5A through 5I are cross sectional views illustrating steps of a method for forming the nonvolatile memory device of FIG. 3.

DETAILED DESCRIPTION

Figure 1A:
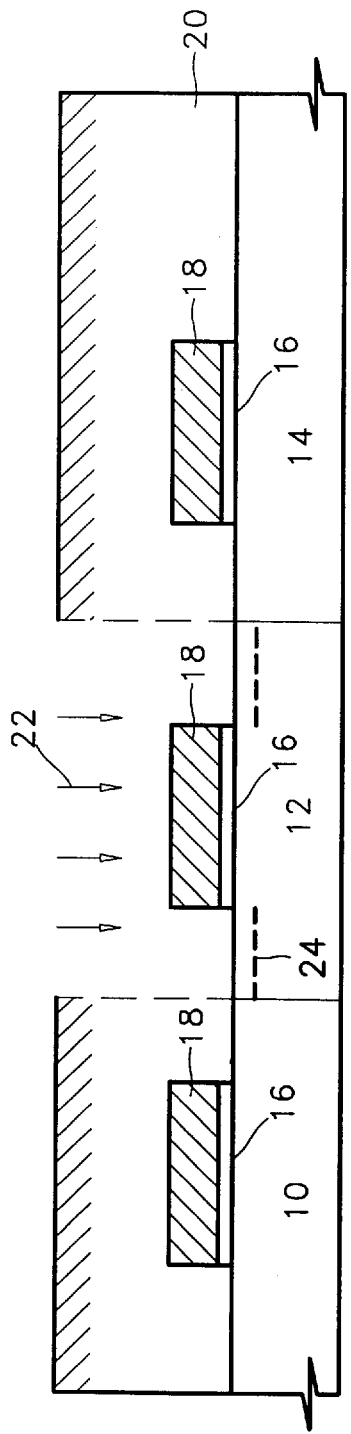
FIGS. 1A through 1F are cross sectional views illustrating steps of method for forming a nonvolatile memory device according to the prior art.
Figure 1B:
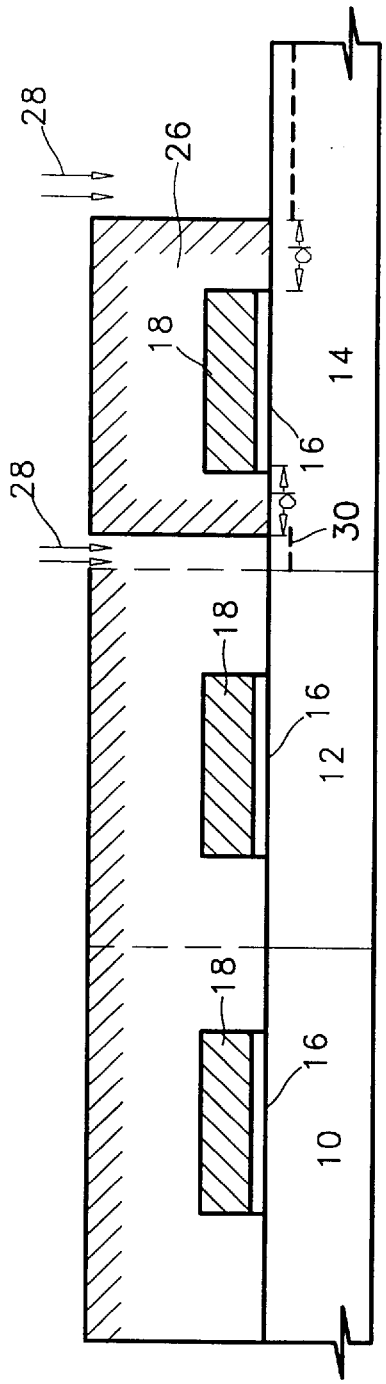
Figure 1C:
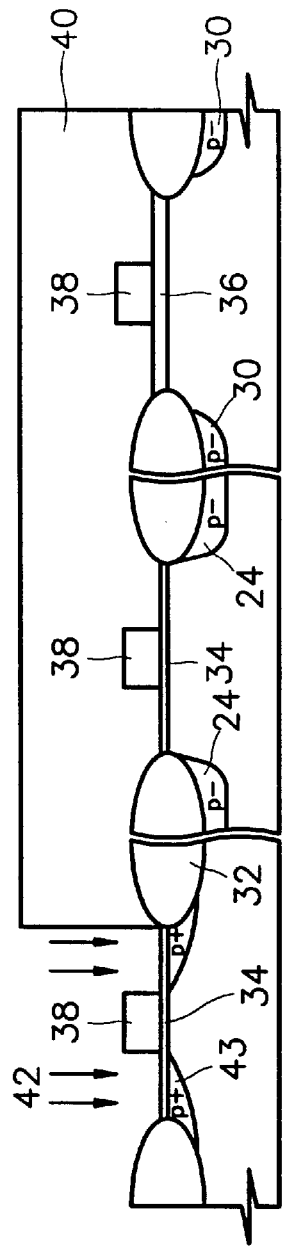
Figure 1D:
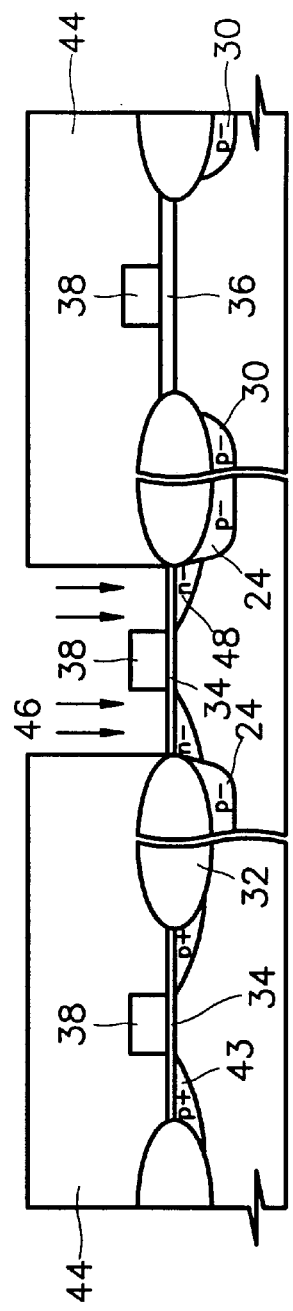
Figure 1E:
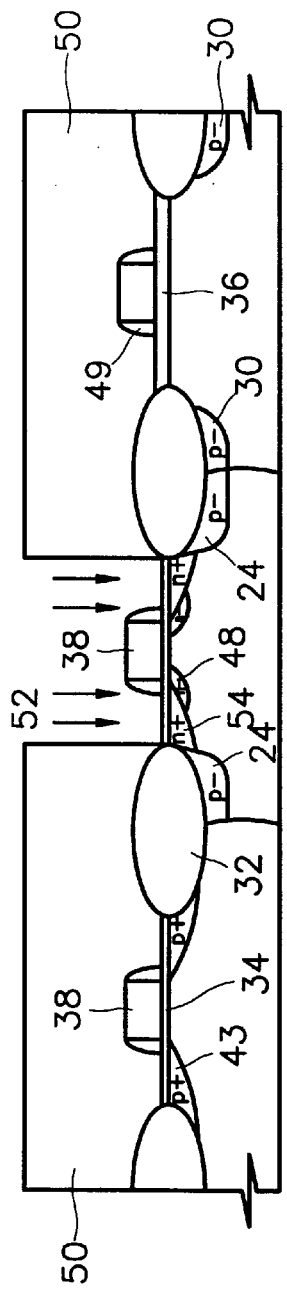
Figure 1F:
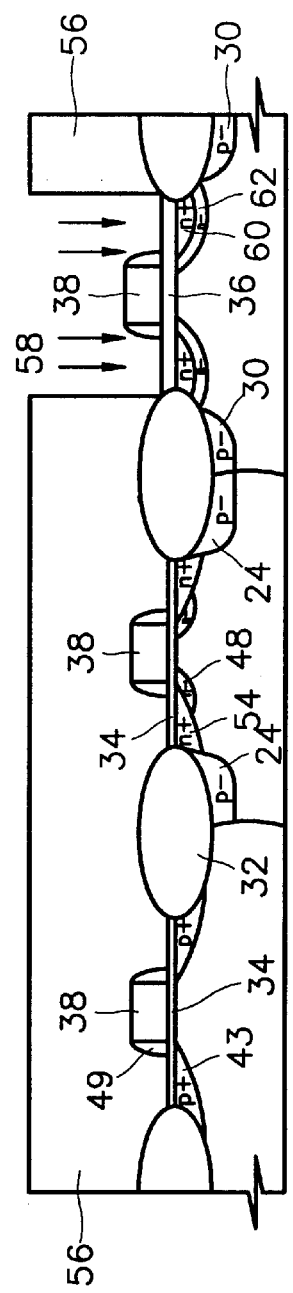

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 2:
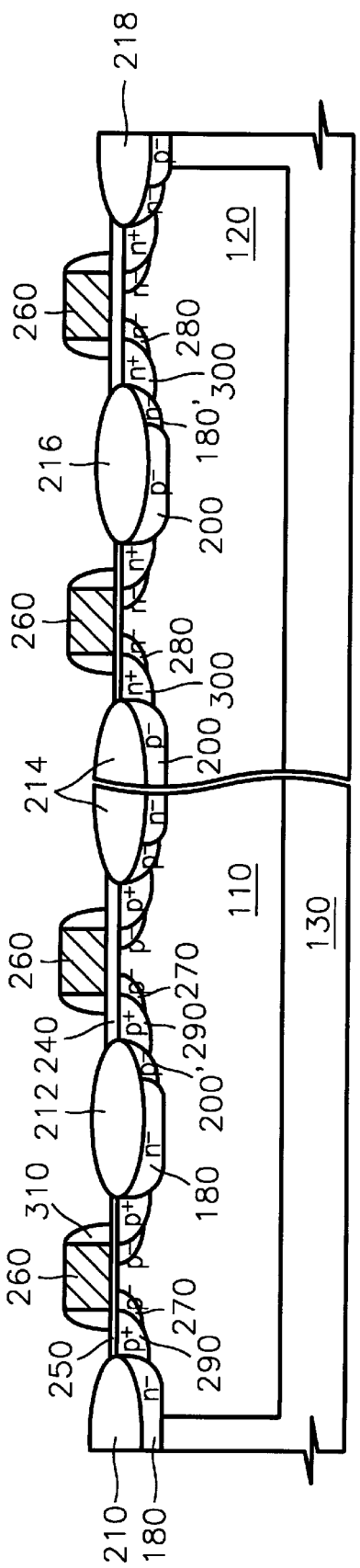
FIG. 2 is a cross sectional view illustrating a first nonvolatile memory device according to the present invention.

FIG. 2 is a cross sectional view of a first peripheral circuit for a nonvolatile memory device according to the present invention. This peripheral circuit includes a low voltage NMOS transistor, a low voltage PMOS transistor, a high voltage NMOS transistor, and a high voltage PMOS transistor. In particular, an N-well 110 and a P-well 120 are provided in a P-type semiconductor substrate 130. The low voltage PMOS transistor and the high voltage PMOS transistor are provided on the N-well 110, and the low voltage NMOS transistor and the high voltage NMOS transistor are provided on the P-well 120.

Both the high voltage PMOS transistor and the low voltage PMOS transistor have a lightly doped drain (LDD) structure with a P$^+$ region 290 and a P$^-$ region 270. In addition, a channel stopper 180 is provided under the isolation oxide layers 210, 212, and 214. The channel stopper 180 is an N-type region with a dopant concentration higher than that of the N-well 110. Gate insulating layers 240 and 250 are formed on respective active regions of the N-well 110, and the gate insulating layer 240 for the high voltage PMOS transistor is thicker than the gate insulating layer 250 for the low voltage PMOS transistor. The gate electrodes 260 are provided on the gate insulating layers 240 and 250, and spacers 310 are provided along the sides of the gate electrodes 260.

In the high voltage PMOS transistor of FIG. 2, a low concentration P$^-$ region 200' is provided between the channel stopper 180 and the P$^+$ region 290, and this P$^-$ region provides an increase in a breakdown voltage. Because the gate insulating layer 240 for the high voltage PMOS transistor is thicker than the gate insulating layer 250 for the low voltage PMOS transistor, the high voltage PMOS transistor has a higher voltage-resistance characteristic allowing an increase in the voltage which can be applied to the gate electrode 260 without causing a breakdown of the gate insulating layer 240. In addition, the source/drain region of the high voltage PMOS transistor has an LDD structure in which dopants are implanted with a relatively low energy, in contrast with the DDD structure wherein dopants are implanted with a relatively high energy. Degradation of the punchthrough characteristic due to lateral diffusion of the dopants in the source/drain region can thus be reduced.

The structure of the transistors formed in the P-well 120 is similar to that of the transistors formed in the N-well 110. In particular, both the high voltage NMOS transistor and the low voltage NMOS transistor have the LDD structure with an N$^+$ region 300 and an N$^-$ region 280. In addition, a channel stopper 200 is formed under the device isolation oxide layers 214, 216, and 218, and the channel stopper 200 is a P-type region with a dopant concentration higher than that of the P-well 120. Similar to the high voltage PMOS transistor, the high voltage NMOS transistor includes a low concentration N$^-$ region 180' between the channel stopper 200 and the N$^+$ region 300, to increase a breakdown voltage. The source/drain region of the high voltage NMOS transistor also has the LDD structure as opposed to the DDD structure, to reduce degradation of the punchthrough characteristics.

Figure 3:
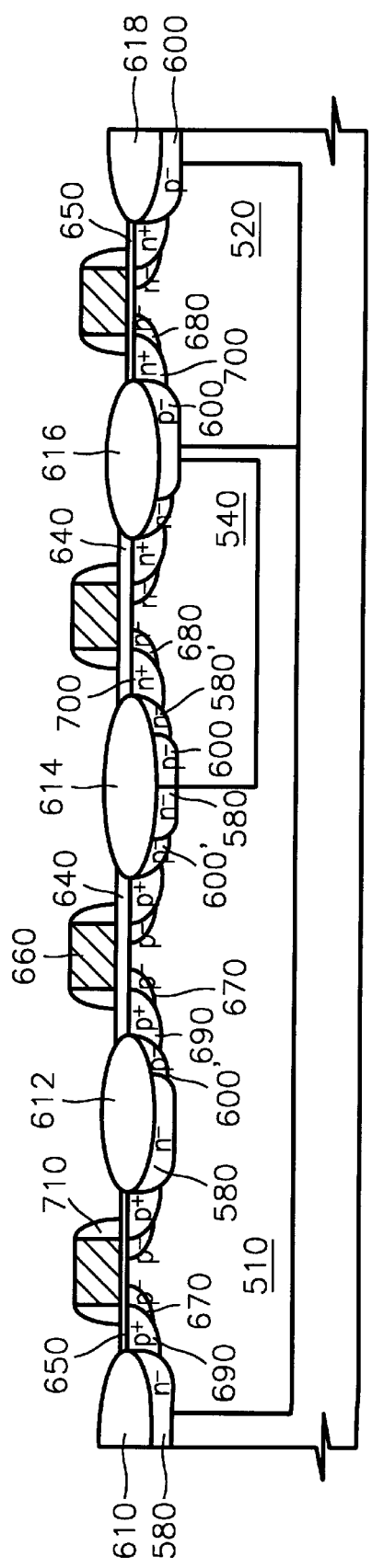
FIG. 3 is a cross sectional view of a second nonvolatile memory device according to the present invention.

FIG. 3 is a cross sectional view of a second peripheral circuit for a nonvolatile memory device according to the present invention. In FIG. 3, reference numerals 510, 520 (540), 530, 580(580'), 600(600'), 610, 612, 614, 616, 618, 640, 650, 660, 670, 680, 690, 700 and 710 respectively correspond to reference numerals 110, 120, 130, 180(180'), 200(200'), 210, 212, 214, 216, 218, 240, 250, 260, 270, 280, 290, 300 and 310 from FIG. 2, and corresponding reference numerals are used to designate similar elements.

The peripheral circuit of FIG. 3 differs from that of FIG. 2 in that the high voltage NMOS transistor is formed in a pocket P-well 540 formed in the N-well 510, and the low voltage NMOS transistor is formed in a P-well 520 separate from the pocket P-well 540. By providing the high voltage NMOS transistor in the pocket P-well 540, a back-bias can be applied thereto, and the low voltage NMOS transistor and the high voltage NMOS transistor can be isolated from each other thus increasing the control thereof.

Figure 4A:
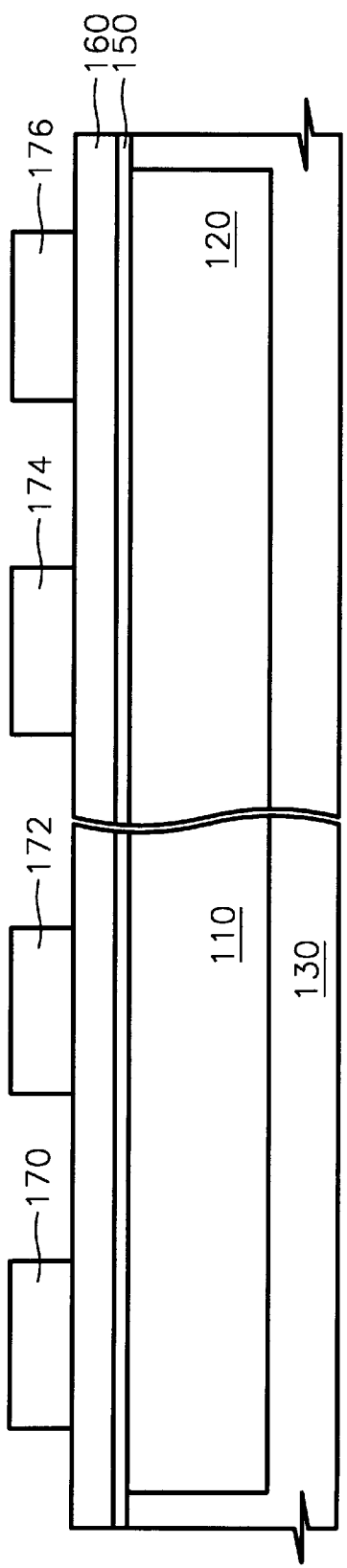

A method for forming the nonvolatile memory device of FIG. 2 will now be described with reference to FIGS. 4A through 4I. As shown in FIG. 4A, an N-well 110 and a P-well 120 are formed in a P-type semiconductor substrate 130. A pad oxide layer 150 and a polysilicon layer 160 are sequentially formed on the substrate 130. A nitride layer is then formed on the polysilicon layer, and patterned to form the patterned nitride layers 170, 172, 174, and 176. The patterned nitride layers can then be used to prevent oxidation of portions of the substrate covered thereby. Accordingly, each patterned nitride layer covers an active region of the substrate and exposes isolation regions of the substrate.

Figure 4B:
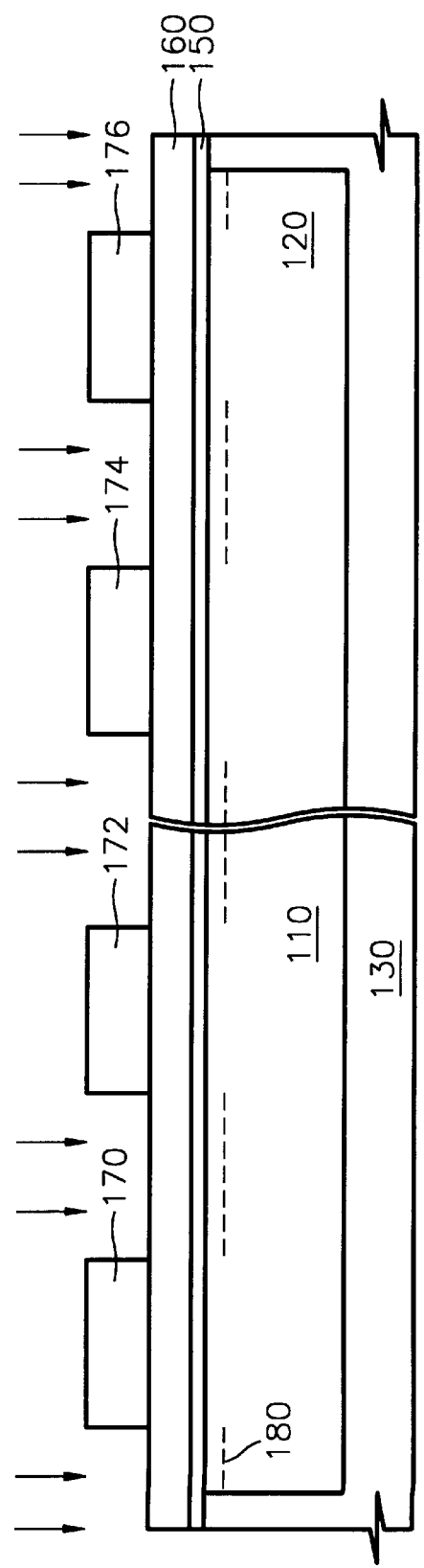

N-type dopants, such as phosphorus (P) ions, are then implanted into exposed portions of the substrate using the patterned nitride layers 170, 172, 174, and 176 as an implant mask, as shown in FIG. 4B. These N-type dopants create N-type isolation regions 180. The isolation characteristics of the low and high voltage PMOS transistors formed in the N-Well 110 can be enhanced by the N-type isolation regions 180.

A first patterned photoresist layer is then formed as shown in FIG. 4C. This patterned photoresist layer is used to form channel stopper regions for the NMOS transistors and to form low concentration dopant regions to increase breakdown voltages of the high voltage PMOS and high voltage NMOS transistors. The first patterned photoresist layer includes a first sub-resist layer 190, a second sub-resist layer 192, and a third sub-resist layer 194. The first sub-resist layer 190 covers the first patterned nitride layer 170 and extends over portions of the N-well 110 adjacent the first patterned nitride layer. The first patterned nitride layer 170 defines the active region of the N-well where the low voltage PMOS transistor will be formed. The first and second sub-resist layers 190 and 192 are spaced apart from the second patterned nitride layer 172 which defines an active region of the substrate where the high voltage PMOS transistor will be formed. The third sub-resist layer 194 covers the fourth patterned nitride layer 176 and extends over portions of the P-well 120 adjacent the fourth patterned nitride layer. The fourth patterned nitride layer defines the active region of the P-well where the high voltage NMOS transistor will be formed.

P-type dopants, such as boron (B) ions, are implanted to form a P-type region 200 using the sub-resist layers 190, 192, and 194, and the patterned nitride layers 172 and 174 as implant masks. The P-type dopants can be implanted with an energy of less than 100 KeV, and preferably with an energy in the range of 30~70 KeV.

The sub-resist layers 190, 192, and 194 are then removed, a LOCOS process is used to form the isolation oxide layers 210, 212, 214, 216, and 218, the patterned nitride layers 170, 172, 174, and 176 are removed, and the oxide and polysilicon layers 150 and 160 are removed as shown in FIG. 4D. The active regions of the N-well and the P-well are thus exposed. The N$^-$ regions 180 are thus under the isolation oxide layers 210, 212, and 214, and these N$^-$ regions thus provide channel stoppers for the PMOS transistors which will be formed in the active regions of the N-well 180 between the isolation oxide layers. The P⁻ regions 200' are under edge portions of the isolation oxide layers 212 and 214 adjacent the active region of the N-well 110 where the high voltage PMOS transistor will be formed.

The P⁻ regions 200 are under the isolation oxide layers 214, 216, and 218, and these P⁻ regions thus provide channel stoppers for the NMOS transistors which will be formed in the active regions of the P-well 120 between the isolation oxide layers. In addition, the N⁻ regions 180' are under edge portions of the isolation oxide layers 216 and 218 adjacent the active region of the P-well 120 where the high voltage NMOS transistor will be formed. The N⁻ regions 180' and the P⁻ regions 200' respectively formed along the edge portions of the isolation oxide layers defining an active region where the high voltage transistors will be formed may thus increase breakdown voltages of the high voltage transistors.

Figure 4E:
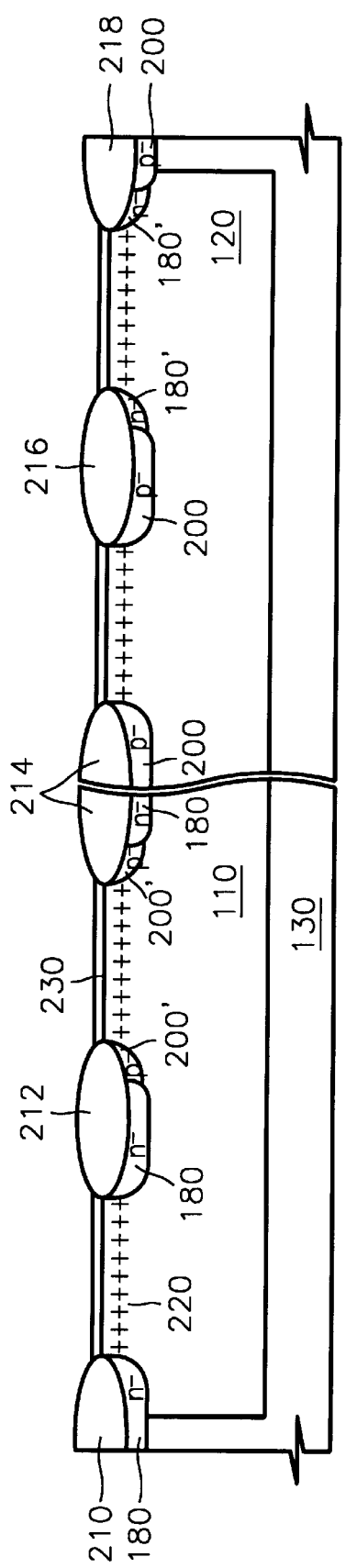

P-type dopants 220 can then be implanted into the active regions of the N-well 110 and the P-well 120, as shown in FIG. 4E. The P-type dopants 220 can be used to control the threshold voltages of the high and low voltage NMOS and PMOS transistors. In addition, a gate insulating layer 230 can be formed on the active regions.

Figure 4F:
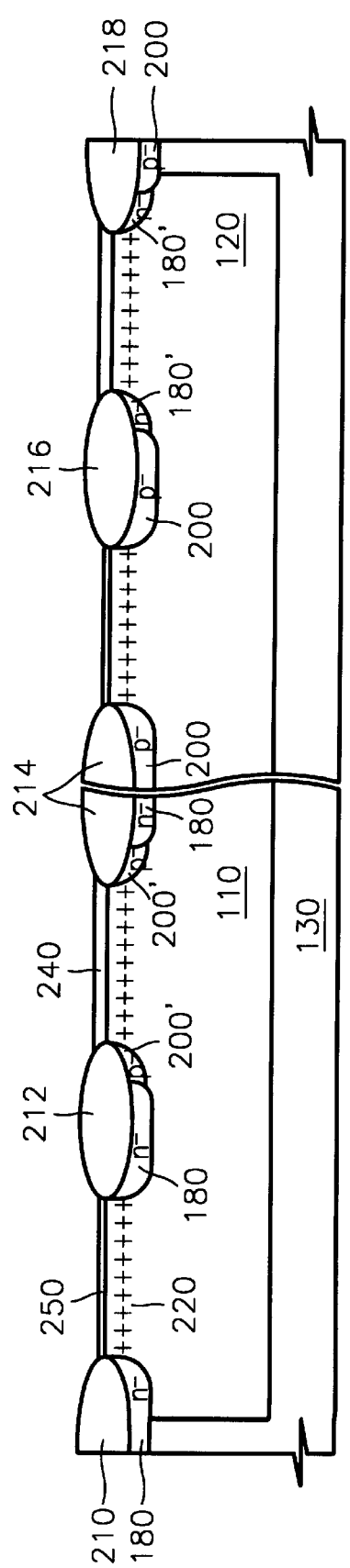

A photoresist layer can be used to cover the active regions for the high voltage NMOS and PMOS transistors while exposing the active regions for the low voltage NMOS and PMOS transistors. This photoresist layer can then be used to selectively remove the gate insulating layers 230 from the active regions for the low voltage NMOS and PMOS transistors using a technique such as a wet etch. After removing this photoresist layer, another oxide layer is grown on the active regions. Accordingly, the gate insulating layers 240 on the active regions where the high voltage NMOS and PMOS transistors will be formed are thicker than the gate insulating layers 250 on the active regions where the low voltage NMOS and PMOS transistors will be formed, as shown in FIG. 4F.

For example, the thickness of the gate insulating layer 250 for the low voltage transistors can be approximately 120 Å, and the thickness of the gate insulating layer 240 for the high voltage transistors can be approximately 300 Å or more. The thinner gate insulating layer 250 allows the low voltage transistors to have an increased driving speed. In contrast, the thicker gate insulating layer 240 allows the high voltage transistors to have higher voltage resistance characteristics thus allowing the high voltage transistors to withstand the application of a high voltage of approximately 15V to the gate thereof.

A conductive layer is then formed on the gate insulating layers 240 and 250, and this layer is patterned to form the gate electrodes 260, as shown in FIG. 4G. A relatively low dose of P-type dopant ions are then implanted using a patterned photoresist layer and the gate electrodes 260 as implant masks. In particular, the patterned photoresist layer covers the P-well 120 while exposing the N-well 110. Accordingly, first source/drain regions 270 for the PMOS transistor can be formed, and the patterned photoresist layer is then removed, as shown in FIG. 4H.

A relatively low dose of N-type dopant ions can then be implanted using another patterned photoresist layer and the gate electrodes 260 as implant masks. In particular, this patterned photoresist layer covers the N-well 110 and exposes the P-well 120. Accordingly, first source/drain regions 280 for the NMOS transistors can be formed, and the patterned photoresist layer is then removed.

Figure 4I:
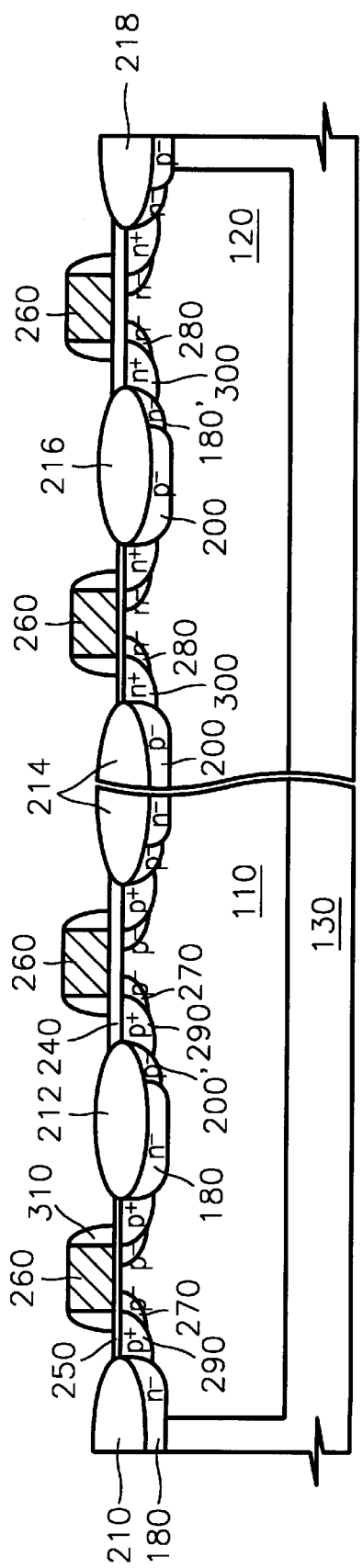

Spacers 310 are then formed along sidewalls of the gate electrodes 260, as shown in FIG. 4I. A relatively high dose of P-type dopant ions are then implanted into the exposed active regions of the N-well 110 using the gate electrodes 260, the spacers 310, and the isolation oxide layers 214, 216, and 218 as implant masks. In addition, a patterned photoresist layer can be used to prevent implanting the high dose of P-type dopant into the P-well. Accordingly, the high dose P-type implant provides the second P⁺ source/drain regions 290 for the PMOS transistors thereby completing the PMOS transistors having the LDD structure.

A relatively high dose of N-type dopant ions are then implanted into the exposed active regions of the P-well using the gate electrodes 260, the spacers 310, and the isolation oxide layers 214, 216, and 218 as implant masks. In addition, a patterned photoresist layer can be used prevent implanting the high dose of N-type dopant into the N-well. Accordingly, the second N⁺ source/drain regions 300 for the NMOS transistors can be formed, thereby completing the NMOS transistors having the LDD structure.

According to the method discussed above, it is not necessary to form separate photoresist patterns defining the respective channel stoppers for the high voltage NMOS and PMOS transistors to space the channel stoppers apart from the respective source/drain regions by a predetermined distance. Moreover, the source/drain regions for the high voltage transistors and for the low voltage transistors can be formed simultaneously. The complexity of the fabrication process can thus be reduced because the number of photoresist patterns used to form the high voltage MOS transistors can be reduced.

Figure 5E:
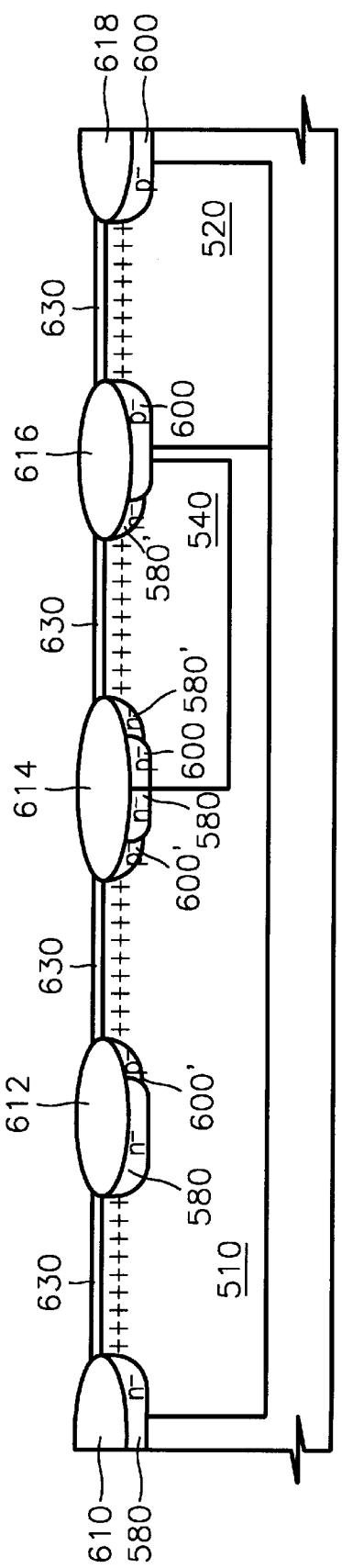
Figure 5F:
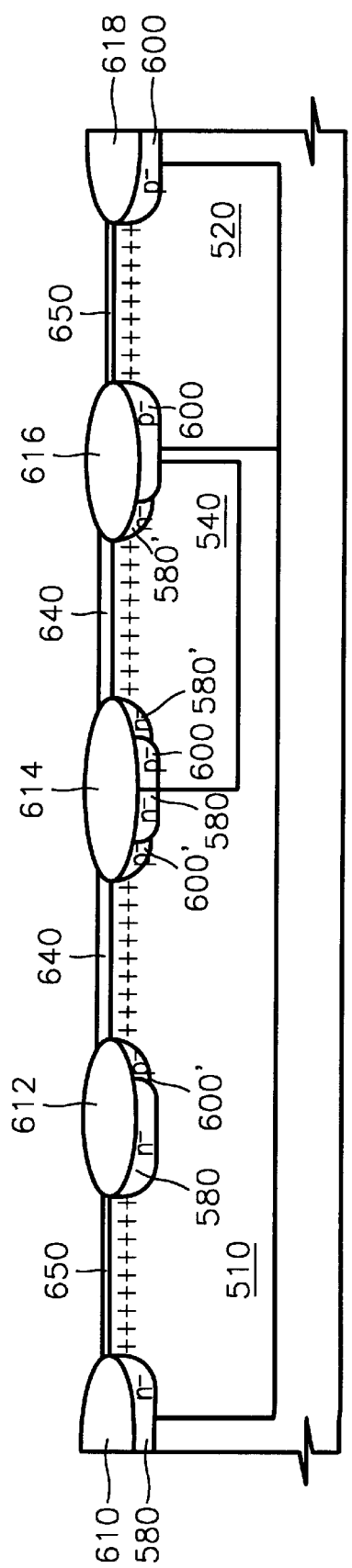
Figure 5I:
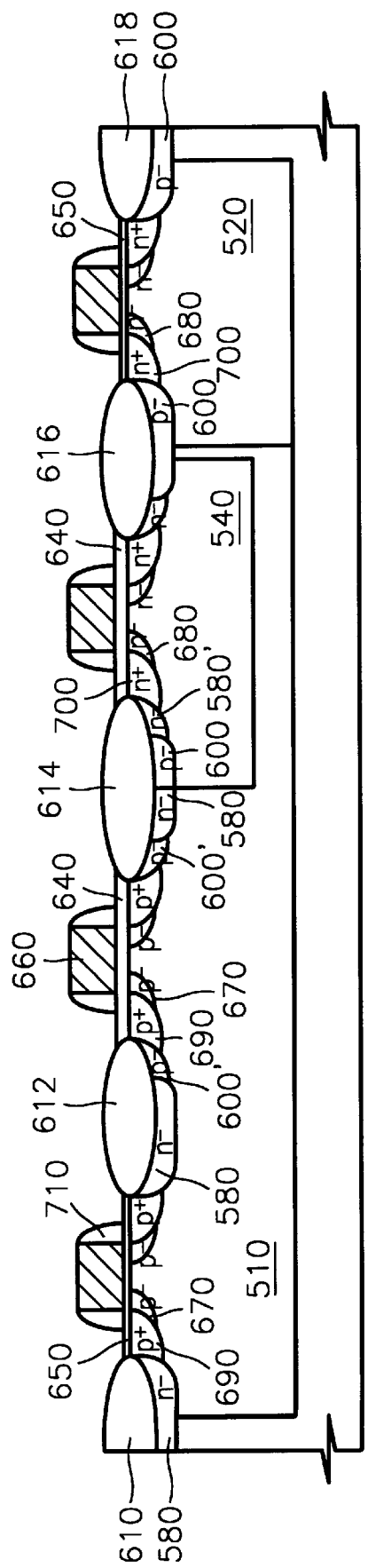

FIGS. 5A through 5I are cross sectional views illustrating steps of a method for forming the peripheral circuit of FIG. 3. As shown in FIG. 5A, an N-well 510 and a P-well 520 are formed in a P-type semiconductor substrate 530, and a pocket P-well 540 is formed in the N-well 510. A low voltage PMOS transistor and a high voltage PMOS transistor can be formed on the N-well 510, a high voltage NMOS transistor can be formed on the pocket P-well 540, and a low voltage NMOS transistor can be formed on the P-well 520. A pad oxide film 550 and a polysilicon film 560 are sequentially formed on the surface of the substrate as discussed above-with regard to FIG. 4A. A nitride layer is then formed on the polysilicon layer 560 and patterned to form the patterned nitride layers 570, 572, 574, and 576. These patterned nitride layers cover the active regions of the substrate and expose the isolation regions of the substrate.

N-type dopants, such as phosphorus (P) ions, are implanted into exposed portions of the substrate using the patterned nitride layers 570, 572, 574, and 576 as implant masks, as shown in FIG. 5B. This implant forms a first N-type region 580. The first N-type region 580 can enhance the isolation characteristics of the low and high voltage PMOS transistors formed in the N-well 510.

As shown in FIG. 5C, a patterned photoresist layer is formed including a first sub-resist layer 590, a second sub-resist layer 592, and a third sub-resist layer 594. This patterned photoresist layer is used to form channel stoppers for the NMOS transistors and to form low concentration dopant regions for increasing the breakdown voltage of the high voltage PMOS and NMOS transistors. In particular, the first sub-resist layer 590 covers the first patterned nitride layer 570 and extends a predetermined distance over the substrate. The first sub-resist layer 590 and second sub-resist layer 592 expose portions of the substrate spaced apart from the second patterned nitride layer 572. The third sub-resist layer 594 covers the third patterned nitride layer 574 and extends a predetermined distance over the substrate.

The first patterned nitride layer 570 covers an active portion of the substrate where the low voltage PMOS transistor will be formed. The second patterned nitride layer 572 covers an active region of the substrate where the high voltage PMOS transistor will be formed. The third patterned nitride layer 574 covers an active region of the substrate where the high voltage NMOS transistor will be formed. The fourth patterned nitride layer 576 covers an active region of the substrate where the low voltage NMOS transistor will be formed. P-type dopants, such as boron (B) ions, are then implanted to form a second P-type region 600 using the sub-resist layers 590, 592, and 594 and the patterned nitride layers 572 and 576 as implant masks.

The sub-resist layers 590, 592, and 594 are then removed, isolation oxide layers 610, 612, 614, 616, and 618 are formed using a LOCOS or other technique, and the patterned nitride layers 570, 572, 574, and 576 are removed as shown in FIG. 5D. The $N^-$ regions 580 under the isolation oxide layers 610, 612, and 614 provide channel stoppers for the PMOS transistors. The $P^-$ region 600' under edge portions of the isolation oxide layer 612 and 614 can increase a breakdown voltage for a high voltage PMOS transistor formed therebetween. The $P^-$ regions 600 under the isolation oxide layers 614, 616, and 618 provide channel stoppers for the NMOS transistors. In addition, $N^-$ regions 580' under edge portions of the isolation oxide layers 614 and 616 can increase a breakdown voltage for a high voltage NMOS transistor formed therebetween. The $N^-$ region 580' and the $P^-$ region 600' under edge portions of the isolation oxide layers defining the high voltage transistors can increase breakdown voltages of the respective high voltage transistors. The steps shown in FIGS. 5E through 5I are performed in a manner similar to that discussed above with regard to FIGS. 4E through 4I.

A nonvolatile memory device including a peripheral circuit according to the present invention can include a dopant region having a relatively low concentration between a channel stopper and a high concentration source/drain region for a high voltage transistor with an LDD structure, to increase the breakdown voltage thereof. In addition, because the high voltage transistors have the LDD structure wherein dopants are implanted with a relatively low energy, degradation of a punchthrough characteristic due to lateral diffusion of dopants in the source/drain region can be reduced. Furthermore, by forming the high voltage NMOS transistor in a pocket P-well which is surrounded by a N-well, a back-bias can be readily applied. The high and low voltage NMOS transistors can also be separately isolated by forming the low voltage NMOS transistor in a separate P-well outside the N-well.

According to the methods of the present invention, a low concentration dopant region can be formed between a source/drain region for a high voltage MOS transistor and a channel stopper by controlling the shape of a photoresist pattern used to form the channel stopper. Therefore, it is not necessary to form a separate photoresist pattern for the channel stopper of a high voltage MOS transistor to space the channel stopper apart from the source/drain region for the high voltage MOS transistor. Because the high voltage MOS transistor has an LDD structure like that of the low voltage MOS transistor, separate photoresist patterns are not required for the high voltage MOS transistor as may be required when forming a high voltage MOS transistor with a DDD structure. In other words, because the number of photolithographic steps can be reduced using a method according to the present invention, the complexity of the method can be reduced thereby reducing cost and increasing yield.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method for forming a peripheral circuit, said method comprising the steps of:

forming first and second well regions in a semiconductor substrate, wherein said first well region has a first conductivity type and said second well region has a second conductivity type;

forming an isolation masking layer on said substrate wherein said isolation masking layer exposes respective isolation regions on said first and second well regions and wherein said isolation masking layer covers respective first and second active regions of said first and second well regions;

simultaneously forming first doped isolation regions in said exposed portions of said first well region having said first conductivity type and second well region having said second conductivity type, wherein said first doped isolation regions have said second conductivity type;

forming a second masking layer exposing portions of said isolation regions on said first well spaced from said first active region and exposing portions of said isolation regions on said second well adjacent said second active region;

simultaneously forming second doped isolation regions in said exposed portions of said isolation regions on said first well having said first conductivity type spaced from said first active region and in said exposed portions of said isolation regions on said second well having said second conductivity type adjacent said second active region, wherein said second doped isolation regions have said first conductivity type;

removing said second masking layer;

forming an isolation layer on said isolation regions;

removing said isolation masking layer thus exposing said active regions of said substrate;

forming respective first and second gate insulating layers on said first and second exposed active regions; and forming respective first and second gate electrodes on said first and second gate insulating layers wherein portions of said active regions are exposed on opposite sides of said gate electrodes.

2. A method according to claim 1 wherein said first and second gate insulating layers have a common thickness, said method further comprising the steps of:

forming first lightly doped regions in said exposed portions of said first active region on opposite sides of said first gate electrode and extending to said isolation regions wherein said first lightly doped regions have said second conductivity type;

forming second lightly doped regions in said exposed portions of said second active region on opposite sides of said second gate electrode and extending to said isolation regions wherein said second lightly doped regions have said first conductivity type;

forming spacers along said opposite sides of said first and second gate electrodes wherein said spacers mask portions of said active regions;

forming first heavily doped regions in said exposed portions of said first active region between said spacers and said isolation regions wherein said first heavily doped regions have said second conductivity type at a dopant concentration higher than that of said first lightly doped regions; and forming second heavily doped regions in said exposed portions of said second active region between said spacers and said isolation regions wherein second heavily doped regions have said first conductivity type at a dopant concentration higher than that of said second lightly doped regions.

3. A method according to claim 2 wherein said dopant concentration of said first heavily doped region has a dopant concentration higher than that of said first doped isolation regions and wherein said second heavily doped region has a dopant concentration higher than that of said second doped isolation regions.

4. A method according to claim 1 wherein said step of forming said first and second well regions comprises forming said first well region in said second well region.

5. A method for forming a peripheral circuit, said method comprising the steps of:

forming a well region of a first conductivity type in a semiconductor substrate;

forming an isolation masking layer on said substrate wherein said isolation masking layer exposes respective isolation regions on said well region and wherein said isolation masking layer covers respective first and second active regions of said well region;

forming first doped isolation regions in said exposed portions of said well region of said semiconductor substrate, wherein said first doped isolation regions have a second conductivity type;

forming a second masking layer exposing portions of said isolation regions on said well region spaced from said first active region and exposing portions of said isolation regions adjacent said second active region;

forming second doped isolation regions in said exposed portions of said isolation regions on said well region spaced from said first active region and in said exposed portions of said isolation regions adjacent said second active region, wherein said second doped isolation regions have said first conductivity type;

removing said second masking layer;

forming an isolation layer on said isolation regions;

removing said isolation masking layer thus exposing said active regions of said substrate;

forming a first gate insulating layer on said first exposed active region;

forming a second gate insulating layer on said second exposed active region; and forming respective first and second gate electrodes on said first and second gate insulating layers wherein portions of said active regions are exposed on opposite sides of said gate electrodes.

6. A method according to claim 5 wherein said first gate insulating layer has a first thickness, and wherein said second gate insulating layer has a second thickness less than said first thickness.

7. A method according to claim 6 further comprising the steps of:

forming lightly doped regions in said exposed portions of said first and second active regions on opposite sides of said first and second gate electrodes and extending to said isolation regions wherein said lightly doped regions have said second conductivity type;

forming spacers along said opposite sides of said first and second gate electrodes wherein said spacers mask portions of said active regions;

forming heavily doped regions in said exposed portions of said first and second active regions between said respective spacers and isolation regions wherein said heavily doped regions have said second conductivity type with a dopant concentration greater than that of said first lightly doped regions.

8. A method according to claim 7 wherein said dopant concentration of said heavily doped regions has a dopant concentration greater than that of said first doped isolation regions.

9. A method according to claim 1 wherein said isolation masking layer covers a third active region on said first well region, wherein said step of removing said isolation mask layer further exposes said third active region of said substrate, and wherein said first and second gate insulating layers have respective first and second thicknesses, said method further comprising the steps of:

forming a third gate insulating layer on the third exposed active region wherein the third gate insulating layer has a third thickness less than the first and second thicknesses; and forming a third gate electrode on the third gate insulating layer wherein portions of said third active region are exposed on opposite sides of said third gate electrode.

10. A method for forming a peripheral circuit, said method comprising the steps of:

forming first and second well regions in a semiconductor substrate, wherein said first well region has a first conductivity type and said second well region has a second conductivity type wherein said first well region is in said second well region;

forming a third well region in said semiconductor substrate wherein said third well region has said first conductivity type and wherein said third well region is outside said second well region;

forming an isolation masking layer on said substrate wherein said isolation masking layer exposes respective isolation regions on said first, second, and third well regions and wherein said isolation masking layer covers respective first, second, and third active regions of said first, second, and third well regions;

simultaneously forming first doped isolation regions in said exposed portions of said first well region having said first conductivity type and second well region having said second conductivity type, wherein said first doped isolation regions have said second conductivity type;

forming a second masking layer exposing portions of said isolation regions on said first well spaced from said first active region and exposing portions of said isolation regions on said second well adjacent said second active region;

simultaneously forming second doped isolation regions in said exposed portions of said isolation regions on said first well having said first conductivity type spaced from said first active region and in said exposed portions of said isolation regions on said second well having said second conductivity type adjacent said second active region, wherein said second doped isolation regions have said first conductivity type;

removing said second masking layer;

forming an isolation layer on said isolation regions;

removing said isolation masking layer thus exposing said active regions of said substrate;

forming respective first, second, and third gate insulating layers on said first, second, and third exposed active regions; and forming respective first, second, and third gate electrodes on said first and second gate insulating layers wherein portions of said active regions are exposed on opposite sides of said gate electrodes.

11. A method according to claim 10 wherein said first and second gate insulating layers have a common thickness, said method further comprising the steps of:

forming first lightly doped regions in said exposed portions of said first active region on opposite sides of said first gate electrode and extending to said isolation regions wherein said first lightly doped regions have said second conductivity type;

forming second lightly doped regions in said exposed portions of said second active region on opposite sides of said second gate electrode and extending to said isolation regions wherein said second lightly doped regions have said first conductivity type;

forming spacers along said opposite sides of said first and second gate electrodes wherein said spacers mask portions of said active regions;

forming first heavily doped regions in said exposed portions of said first active region between said spacers and said isolation regions wherein said first heavily doped regions have said second conductivity type at a dopant concentration higher than that of said first lightly doped regions; and forming second heavily doped regions in said exposed portions of said second active region between said spacers and said isolation regions wherein second heavily doped regions have said first conductivity type at a dopant concentration higher than that of said second lightly doped regions.

12. A method according to claim 11 wherein said dopant concentration of said first heavily doped region has a dopant concentration higher than that of said first doped isolation regions and wherein said second heavily doped region has a dopant concentration higher than that of said second doped isolation regions.

13. A method according to claim 10 wherein said first and second gate insulating layers have respective first and second thicknesses, and wherein the third gate insulating layer has a third thickness less than the first and second thicknesses.

14. A method for forming a peripheral circuit, said method comprising the steps of:

forming a first well region of a first conductivity type in a semiconductor substrate;

forming a second well region of a second conductivity type in the first well region of the first conductivity type;

forming an isolation masking layer on said substrate wherein said isolation masking layer exposes respective isolation regions on said first and second well regions and wherein said isolation masking layer covers respective first and second active regions of said first well region and covers a third active region of said second well region;

forming first doped isolation regions in said exposed portions of said first well region of said semiconductor substrate, wherein said first doped isolation regions have a second conductivity type;

forming a second masking layer exposing portions of said isolation regions on said first well region spaced from said first active region and exposing portions of said isolation regions adjacent said second active region;

forming second doped isolation regions in said exposed portions of said isolation regions on said first well region spaced from said first active region and in said exposed portions of said isolation regions adjacent said second active region, wherein said second doped isolation regions have said first conductivity type;

removing said second masking layer;

forming an isolation layer on said isolation regions;

removing said isolation masking layer thus exposing said active regions of said substrate;

forming a first gate insulating layer on said first exposed active region;

forming a second gate insulating layer on said second exposed active region;

forming a third gate insulating layer on said third exposed active region; and forming respective first, second, and third gate electrodes on said first, second, and third gate insulating layers wherein portions of said active regions are exposed on opposite sides of said gate electrodes.

15. A method according to claim 14 wherein said first gate insulating layer has a first thickness, and wherein said second gate insulating layer has a second thickness less than said first thickness.

16. A method according to claim 15 further comprising the steps of:

forming lightly doped regions in said exposed portions of said first and second active regions on opposite sides of said first and second gate electrodes and extending to said isolation regions wherein said lightly doped regions have said second conductivity type;

forming spacers along said opposite sides of said first and second gate electrodes wherein said spacers mask portions of said active regions; and forming heavily doped regions in said exposed portions of said first and second active regions between said respective spacers and isolation regions wherein said heavily doped regions have said second conductivity type with a dopant concentration greater than that of said first lightly doped regions.

17. A method according to claim 16 wherein said dopant concentration of said heavily doped regions has a dopant concentration greater than that of said first doped isolation regions.

18. A method according to claim 14 further comprising the steps of:

forming a third well region of said second conductivity type in said semiconductor substrate outside said first well region wherein said isolation masking layer covers a respective fourth active region of said third well region;

forming a fourth gate insulating layer on said fourth exposed active region; and forming a fourth gate electrode on said fourth gate insulating layer wherein portions of said fourth active region are exposed on opposite sides of said fourth gate electrode.

* * * * *